United States Patent
Ryu et al.

(10) Patent No.: US 9,524,992 B2
(45) Date of Patent: Dec. 20, 2016

(54) THIN FILM TRANSISTOR ARRAY PANEL AND MANUFACTURING METHOD THEREOF

(71) Applicant: SAMSUNG DISPLAY CO., LTD., Yongin, Gyeonggi-Do (KR)

(72) Inventors: Hye Young Ryu, Seoul (KR); Hee Jun Byeon, Suwon-si (KR); Woo Geun Lee, Yongin-si (KR); Kap Soo Yoon, Seoul (KR); Yoon Ho Kim, Seoul (KR); Chun Won Byun, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/875,320

(22) Filed: Oct. 5, 2015

(65) Prior Publication Data
US 2016/0027805 A1 Jan. 28, 2016

Related U.S. Application Data

(62) Division of application No. 13/618,308, filed on Sep. 14, 2012, now Pat. No. 9,153,600.

(30) Foreign Application Priority Data

Feb. 16, 2012 (KR) .................. 10-2012-0015901

(51) Int. Cl.
*G02F 1/1362* (2006.01)
*H01L 27/12* (2006.01)
(Continued)

(52) U.S. Cl.
CPC ........... *H01L 27/127* (2013.01); *G02F 1/1368* (2013.01); *G02F 1/134363* (2013.01);
(Continued)

(58) Field of Classification Search
CPC ............ G02F 1/13622; G02F 1/136227; G02F 1/136286; G02F 2001/13629; G02F 2001/136295; H01L 27/1214; H01L 27/124; H01L 27/1244; H01L 27/1248
(Continued)

(56) References Cited

U.S. PATENT DOCUMENTS 6,057,562 A   5/2000 Lee et al.
6,249,330 B1  6/2001 Yamaji et al.
(Continued)

FOREIGN PATENT DOCUMENTS

JP   2008-112912   5/2008
JP   2009-010052   1/2009
(Continued)

*Primary Examiner* — Eric Ward
(74) *Attorney, Agent, or Firm* — Innovation Counsel LLP

(57) ABSTRACT

A thin film transistor array panel and a manufacturing method thereof according to an exemplary embodiment of the present invention form a contact hole in a second passivation layer formed of an organic insulator, protect a side of the contact hole by covering with a protection member formed of the same layer as the first field generating electrode and formed of a transparent conductive material, and etch the first passivation layer below the second passivation layer using the protection member as a mask. Therefore, it is possible to prevent the second passivation layer formed of an organic insulator from being overetched while etching the insulating layer below the second passivation layer so that the contact hole is prevented from being made excessively wide.

16 Claims, 32 Drawing Sheets

(51) Int. Cl.
*G02F 1/1343* (2006.01)
*G02F 1/1368* (2006.01)

(52) U.S. Cl.
CPC .. *G02F 1/136227* (2013.01); *G02F 1/136286* (2013.01); *H01L 27/124* (2013.01); *H01L 27/1225* (2013.01); *H01L 27/1248* (2013.01); *H01L 27/1262* (2013.01); *G02F 2001/136222* (2013.01); *G02F 2001/136295* (2013.01)

(58) Field of Classification Search
USPC .................. 257/49–75, 79–103; 438/22–47, 438/149–166; 349/106–109
See application file for complete search history.

(56) References Cited

U.S. PATENT DOCUMENTS

| | | | |
|---|---|---|---|
| 6,466,280 B1 | 10/2002 | Park et al. | |
| 6,654,076 B2 | 11/2003 | Ha et al. | |
| 6,856,361 B2 | 2/2005 | Kim et al. | |
| 7,612,373 B2* | 11/2009 | Park | G02F 1/13458 257/59 |
| 7,630,045 B2* | 12/2009 | Matsumoto | G02F 1/134363 349/114 |
| 7,652,422 B2 | 1/2010 | Bae et al. | |
| 7,675,592 B2 | 3/2010 | Ochiai et al. | |
| 7,696,529 B2* | 4/2010 | Choo | G02F 1/136227 257/114 |
| 7,884,366 B2 | 2/2011 | Kwak et al. | |
| 7,952,671 B2 | 5/2011 | Aota et al. | |
| 7,989,243 B2 | 8/2011 | Liao et al. | |
| 8,294,863 B2 | 10/2012 | Ninomiya et al. | |
| 8,471,988 B2 | 6/2013 | Shibata et al. | |
| 2007/0058099 A1* | 3/2007 | Eguchi | G02F 1/136227 349/43 |
| 2009/0115950 A1 | 5/2009 | Toyota et al. | |
| 2010/0123137 A1 | 5/2010 | Yang et al. | |
| 2011/0199564 A1 | 8/2011 | Moriwaki | |
| 2011/0242443 A1* | 10/2011 | Choi | C08G 8/12 349/38 |
| 2012/0268396 A1 | 10/2012 | Kim et al. | |
| 2013/0010246 A1 | 1/2013 | Miwa et al. | |
| 2013/0020591 A1 | 1/2013 | Park et al. | |
| 2013/0083265 A1 | 4/2013 | Misaki | |
| 2014/0042444 A1 | 2/2014 | Huang et al. | |

FOREIGN PATENT DOCUMENTS

| | | |
|---|---|---|
| KR | 1020010025955 | 4/2001 |
| KR | 1020020075011 | 10/2002 |
| KR | 1020060069102 | 6/2006 |
| KR | 1020060073997 | 6/2006 |
| KR | 1020090017200 | 2/2009 |
| KR | 1020130011856 | 1/2013 |

* cited by examiner

THIN FILM TRANSISTOR ARRAY PANEL AND MANUFACTURING METHOD THEREOF

CROSS-REFERENCE TO RELATED APPLICATION

This application is a divisional application which claims priority to and the benefit of U.S. patent application Ser. No. 13/618,308 filed on Sep. 14, 2012, which claims priority to and the benefit of Korean Patent Application No. 10-2012-0015901 filed in the Korean Intellectual Property Office on Feb. 16, 2012, the entire contents of which are incorporated herein by reference.

BACKGROUND OF THE INVENTION (a) Field of the Invention

Embodiments of the present invention relate generally to thin film transistor array panels and a manufacturing method thereof.

More specifically, embodiments of the invention relate to methods and processes for fabricating thin film transistor array panels.

(b) Description of the Related Art

A liquid crystal display is one type of flat panel display which is widely used, and includes two substrates on which field generating electrodes such as pixel electrodes and common electrodes are formed respectively, with a liquid crystal layer interposed therebetween. By applying voltage to the field generating electrode to generate an electric field in the liquid crystal layer, the direction of liquid crystal molecules of the liquid crystal layer is determined and the polarization of the incident light is controlled to display images.

In case of IPS (In-plane Switching) LCDs, FFS (Fringe Field Switching) LCDs and AFFS (Advanced Fringe Field Switching) LCDs, two field generating electrodes that generate the electric field in the liquid crystal layer are formed on a thin film transistor array panel.

When the two field generating electrodes are formed on the thin film transistor array panel, a plurality of insulating layers are disposed between the thin film transistor and the field generating electrodes and at least one of the plurality of insulating layers may be formed of an organic insulator. When contact holes for electrically connecting the thin film transistor and the field generating electrode are formed in the plurality of insulating layers, the width of the contact holes becomes larger during a process of etching the insulating layers.

Accordingly, when the width of the contact holes becomes larger, an aperture ratio of the liquid crystal display that uses the thin film transistor array panel is deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a thin film transistor array panel that forms two field generating electrodes on a thin film transistor array panel and prevents a width of a contact hole from becoming larger even when an organic insulator is used and a manufacturing method thereof.

An exemplary embodiment of the present invention provides a thin film transistor array panel, including: a substrate; a thin film transistor disposed on the substrate; a first passivation layer formed on the thin film transistor; a second passivation layer formed on the first passivation layer and including an organic insulator; a first field generating electrode formed on the second passivation layer, the first passivation layer and the second passivation layer having a first contact hole that partially exposes the thin film transistor; a third passivation layer formed on the first field generating electrode; a second field generating electrode formed on the third passivation layer; and a first protection member formed on at least a part of a side of the second passivation layer in the first contact hole. The first protection member may be formed of the same layer as the first field generating electrode.

The first contact hole may have a first portion formed in the second passivation layer and a second portion formed in the first passivation layer, and the second portion may be aligned to edges of the first protection member.

The third passivation layer may have an opening that exposes at least a part of the first protection member and the second portion of the first contact hole.

The second field generating member is connected to the thin film transistor through the opening. The second passivation layer may be a color filter.

Another exemplary embodiment of the present invention provides a manufacturing method of a thin film transistor array panel, including:

forming a thin film transistor on a substrate; forming a first passivation layer on the thin film transistor; forming a second passivation layer including an organic insulator on the first passivation layer; forming a first portion of a first contact hole in the second passivation layer; forming a second portion of the first contact hole (that partially exposes the thin film transistor) in the first passivation layer; forming a first protection member on at least a part of a side of the second passivation layer in the first contact hole and a first field generating electrode on the second passivation layer; forming a third passivation layer on the first field generating electrode, and forming a second field generating electrode on the third passivation layer. The forming a second portion of the first contact hole in the first passivation layer may include etching the first passivation film using the first protection member as a mask. The forming a third passivation layer may include forming a third passivation film and removing the third passivation film at least on a part of the first protection member and the second portion of the first contact hole. The forming a first protection member and a first field generating electrode may include forming a transparent conductive material connected to the thin film transistor through the second portion of the first contact hole, and patterning the transparent conductive film to form the first protection member having a opening on the second portion of the first contact hole and the first field generating electrode. As described above, a thin film transistor array panel according to an exemplary embodiment of the present invention protects a side of the contact hole formed in an organic insulating layer by covering with a protection member formed of a transparent conductive material, and etches the insulating layer below the organic insulating layer using the protection member as a mask. Therefore, it is possible to prevent the organic insulating layer formed of an organic insulator from being overetched while etching the insulating layer below the organic insulating layer so that the contact hole is prevented from being wider. Further, since the protection member is formed of the same layer as the field generating electrode, an additional process for forming the protection member is not required. In addition, since the protection member is formed of the transparent conductive material, it is possible to enhance the electrical connection between the layer exposed through the contact hole and the layer formed on the protection member.

DETAILED DESCRIPTION OF THE EMBODIMENTS

Figure 1:
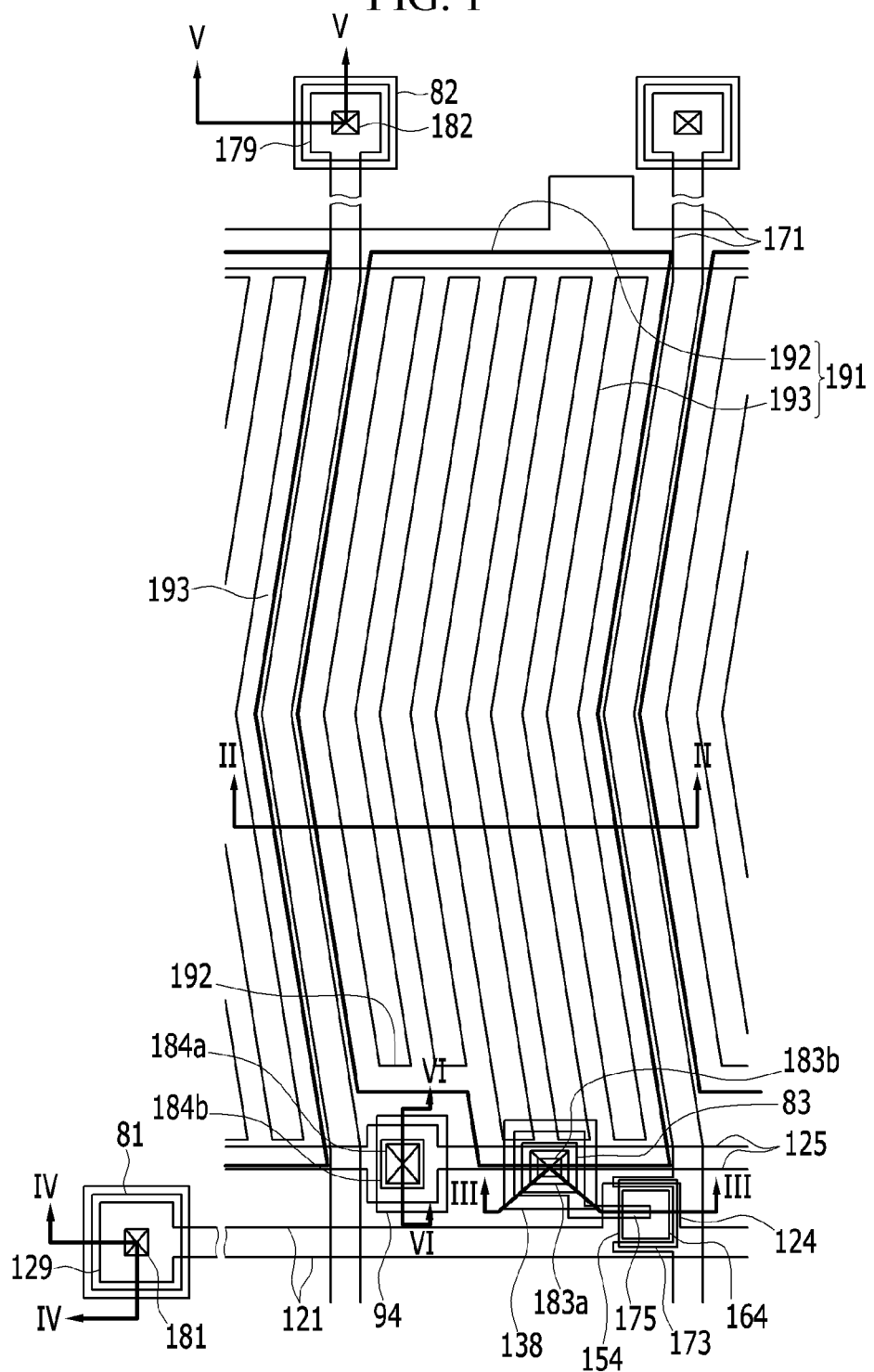
FIG. 1 is a layout view of a thin film transistor array panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, with reference to drawings, exemplary embodiments of the present invention will be described.

Figure 2:
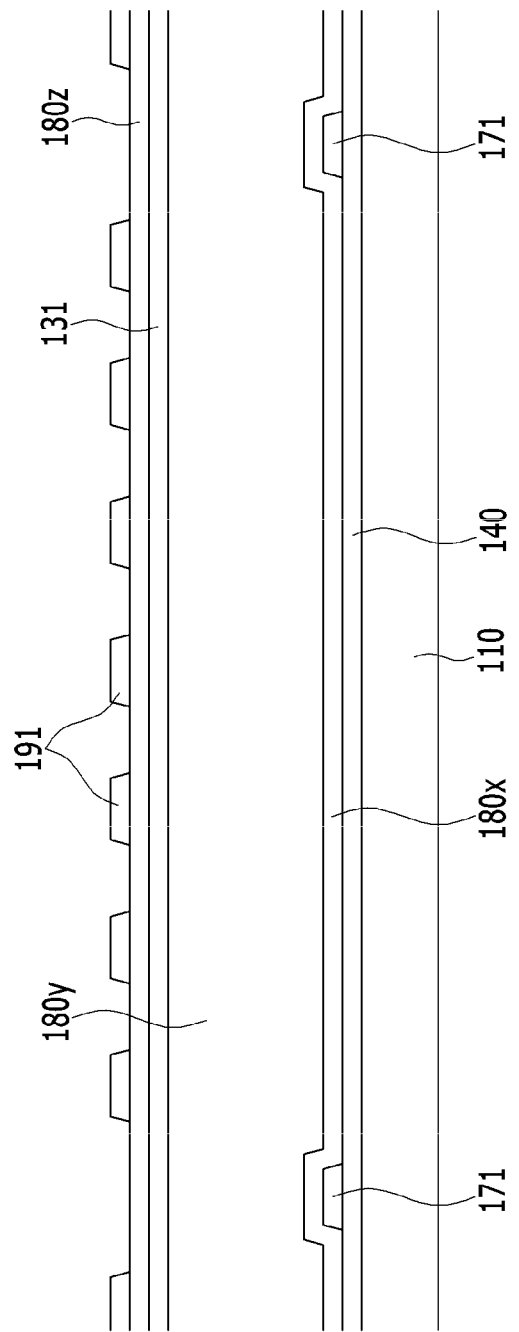
FIG. 2 is a cross-sectional view of the thin film transistor array panel of FIG. 1 taken along line II-II.
Figure 3:
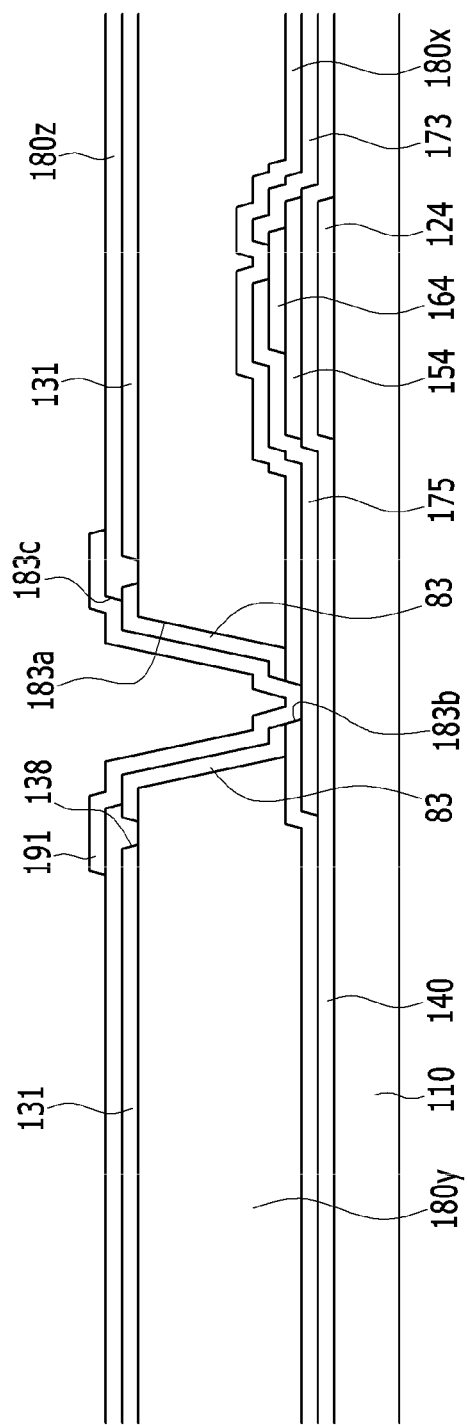
FIG. 3 is a cross-sectional view of the thin film transistor array panel of FIG. 1 taken along line III-III.
Figure 4:
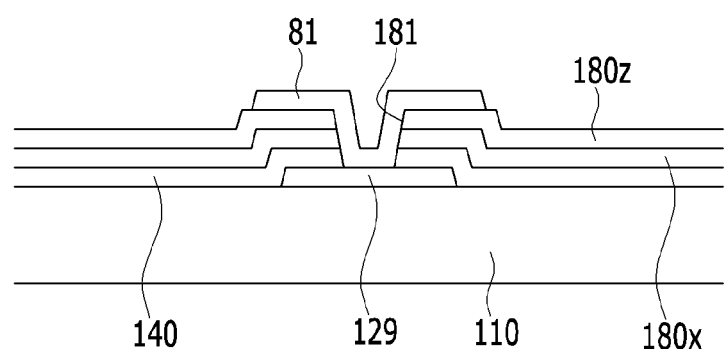
FIG. 4 is a cross-sectional view of the thin film transistor array panel of FIG. 1 taken along line IV-IV.
Figure 5:
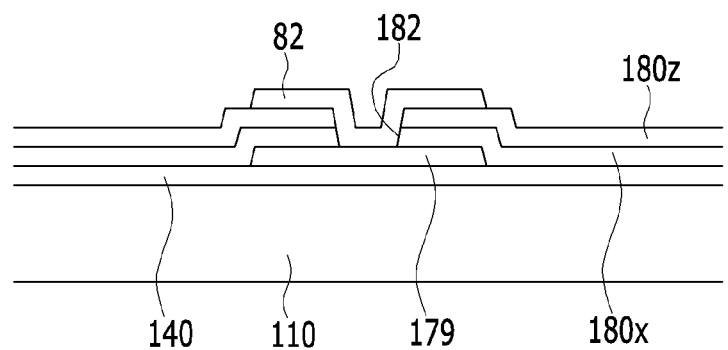
FIG. 5 is a cross-sectional view of the thin film transistor array panel of FIG. 1 taken along line V-V.
Figure 6:
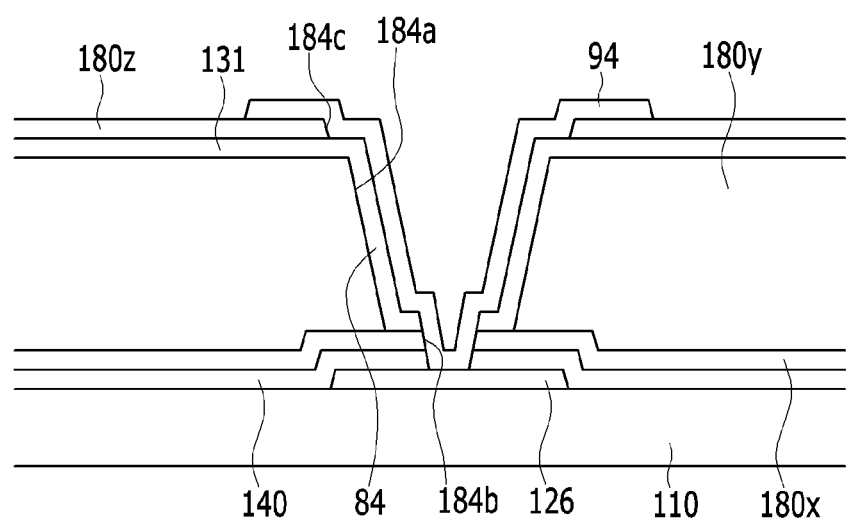
FIG. 6 is a cross-sectional view of the thin film transistor array panel of FIG. 1 taken along line VI-VI.

First, referring to FIGS. 1 to 6, a thin film transistor array panel according to an exemplary embodiment of the present invention will be described. FIG. 1 is a layout view of a thin film transistor array panel according to an exemplary embodiment of the present invention. FIG. 2 is a cross-sectional view of the thin film transistor array panel of FIG. 1 taken along line II-II. FIG. 3 is a cross-sectional view of the thin film transistor array panel of FIG. 1 taken along line III-III. FIG. 4 is a cross-sectional view of the thin film transistor array panel of FIG. 1 taken along line IV-IV. FIG. 5 is a cross-sectional view of the thin film transistor array panel of FIG. 1 taken along line V-V. FIG. 6 is a cross-sectional view of the thin film transistor array panel of FIG. 1 taken along line VI-VI.

Referring to FIGS. 1 to 6, a plurality of gate conductors that include a plurality of gate lines 121 and a plurality of common voltage lines 125 are formed on an insulation substrate 110.

Each of the gate lines 121 includes a plurality of gate electrodes 124 and a wide gate pad 129 for connecting with another layers and an external driving circuit. A gate driving circuit (not shown) that generates a gate signal may be disposed on a flexible printed circuit film (not shown) attached on the substrate 110 or directly disposed on the substrate 110.

The common voltage lines 125 transmit a predetermined voltage such as a common voltage Vcom, substantially extend in a horizontal direction, and are substantially parallel to the gate lines 121. Each of the common voltage lines 125 may include a plurality of extension portions 126.

The gate conductors 121 and 125 may be formed of a single layer or a multilayer having two or more conductive layers.

A gate insulating layer 140 is formed on the gate conductors 121 and 125. The gate insulating layer 140 may be formed of an inorganic insulator such as silicon nitride (SiNx) or silicon oxide (SiOx).

A plurality of semiconductors 154 are formed on the gate insulating layer 140. The semiconductor 154 is an oxide semiconductor, and formed of GIZO, ZTO (ZnSnO), or IZO.

An etch stop layer 164 is formed on the semiconductor 154. (Missing in FIG. 1) The etch stop layer 164 is formed of silicon nitride and covers a channel of the semiconductor 154 to prevent the damage of the channel caused by the etching solution in the subsequent processes. The etch stop layer 164 may be formed of an insulator such as silicon oxide (SiOx).

On a semiconductor 154 that is not covered with the etch stop layer 164 and a portion of the etch stop layer 164, a data conductor including a plurality of data lines 171 and a plurality of drain electrodes 175 is formed.

The data lines 171 transmit the data signal and substantially extend in a vertical direction to intersect the gate lines 121 and the common voltage lines 125. Each of the data lines 171 includes a plurality of source electrodes 173 extending toward the gate electrodes 124 and a wide data pad 179 for connecting with another layers and an external driving circuit. A gate driving circuit (not shown) that generates a gate signal may be disposed on a flexible printed circuit film (not shown) attached on the substrate 110 or directly disposed on the substrate 110.

The data line 171 is periodically curved or bent, and thus forms an oblique angles with the direction of extension of the gate line 121. The oblique angle of the data line 171 and the extension direction of the gate line 121 may be 45 degree or bigger. However, in case of another thin film transistor array panel according to another exemplary embodiment of the present invention, the data line 171 may straightly extend.

The drain electrode 175 includes a generally rod shaped tip portion that faces the source electrode 173 with respect to the gate electrode 124, and another tip portion having a wider area.

The data conductor 171 and 175 may be formed of a single layer or a multilayer having two or more conductive layers.

One gate electrode 124, one source electrode 173, and one drain electrode 175 form a thin film transistor (TFT) together with the semiconductor 154. A channel of the thin film transistor is formed in the semiconductor 154 between the source electrode 173 and the drain electrode 175.

A barrier layer that prevents the reaction between the oxide semiconductor 154 and the data conductor or the diffusion of some components is formed between the semiconductor layer 154 including an oxide semiconductor and the source electrode 173, a drain electrode 175 and the data line 171. For example, the barrier layer may contain zinc gallium oxide (GZO).

A first passivation layer 180x is formed on the data line 171 and the drain electrode 175.

The first passivation layer 180x may be formed of an organic insulating material or an inorganic insulating material.

A second passivation layer 180y is disposed on the first passivation layer 180x. The second passivation layer 180y includes an organic material and the surface of the second passivation layer 180y is substantially flat. The second passivation layer 180y is removed from a region corresponding to the gate pad 129 and data pad 179.

Even though not shown, in the case of the thin film transistor array panel according to another exemplary embodiment of the present invention, the second passivation layer 180y may be a color filter. Further, the thin film transistor array panel may further include a layer disposed on the second passivation layer 180y. For example, the thin film transistor array panel may further include an overcoat film (capping layer) that is disposed on the color filter to prevent the pigment of the color filter from flowing into the liquid crystal layer. The overcoat film may be formed of an insulating material such as silicon nitride (SiNx).

A first field generating electrode 131 is formed on the second passivation layer 180y. The first field generating electrode 131 may be formed of a transparent conductive material such as ITO or IZO. In the present exemplary embodiment, the first field generating electrode 131 may be a panel plate.

The first field generating electrode 131 includes an opening 138 that is formed in a region corresponding to the drain electrode 175.

A third passivation layer 180z is formed on the first field generating electrode 131 and a second field generating electrode 191 is formed on the third passivation layer 180z. The second field generating electrode 191 may be formed of a transparent conductive material such as ITO or IZO.

The second field generating electrode 191 includes a plurality of branch electrodes 193 that substantially extend parallel to each other and are spaced apart from each other and upper and lower horizontal portions 192 that connect a lower end part and an upper end part of the branch electrodes 193. The branch electrodes 193 of the second field generating electrode 191 may be curved along the data lines 171. However, in the case of a thin film transistor array panel according to another exemplary embodiment of the present invention, the data lines 171 and the branch electrodes 193 of the second field generating electrode 191 may extend in a straight line.

A first contact hole 183 that partially exposes the drain electrode 175 is formed in the first passivation layer 180x, the second passivation layer 180y, and the third passivation layer 180z. The first contact hole 183 includes a first portion 183a formed on the second passivation layer 180y, a second portion 183b formed on the first passivation layer 180x, and a third portion 183c formed on the third passivation layer 180z.

A first protection member 83 is formed on at least a part of the side of the first portion 183a of the first contact hole 183 formed in the second passivation layer 180y. The first protection member 83 may be formed of the same layer as the first field generating electrode 131.

The second portion 183b of the first contact hole 183 formed in the first passivation layer 180x is formed by etching the first passivation film 180x using the first protection member 83 as an etching mask. Therefore, the second portions 183b of the first contact hole 183 formed in the first passivation layer 180x are aligned to the edge of the first protection member 83.

Since at least a part of the side of the second passivation layer 180y is covered by the first protection member 83, when the first passivation layer 180x and the third passivation layer 180z are etched, it prevents the second passivation layer 180y formed of an organic film from being overetched. Therefore, by preventing the second passivation layer 180y from being overetched, it is possible to prevent the first contact hole 183 from being made wider.

Further, since the first protection member 83 is formed of the same layer as the first field generating electrode 131, the first protection member is formed of a transparent conductor. Therefore, the drain electrode 175b exposed through the first contact hole 183 can electrically contact a second field generating electrode 191 formed thereon. More specifically, the first protection member 83 formed of a conductor is disposed between the part of the drain electrode 175 exposed by the second portion 183b of the first contact hole 183, and the second field generating electrode 191 formed thereon. Therefore, the drain electrode 175 and the second field generating electrode 191 are electrically connected to each other through the first protection member 83. Accordingly, even if the second field generating electrode 191 becomes thinner or is cut on a part of the first protection member 83, a signal of the drain electrode 175 is still transmitted to the second field generating electrode 191 through the first protection member 83.

Figure 7:
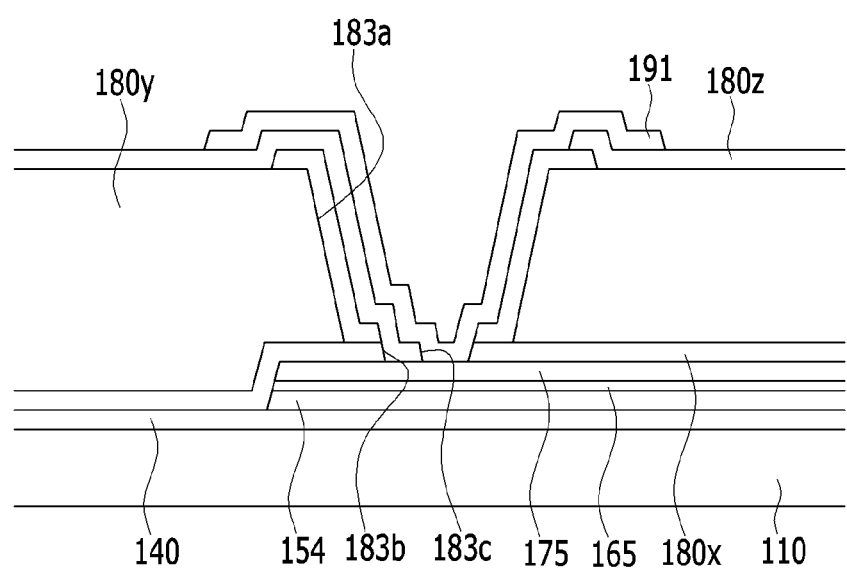
FIG. 7 is a cross-sectional view of a part of a thin film transistor array panel according to another exemplary embodiment of the present invention.
Figure 8:
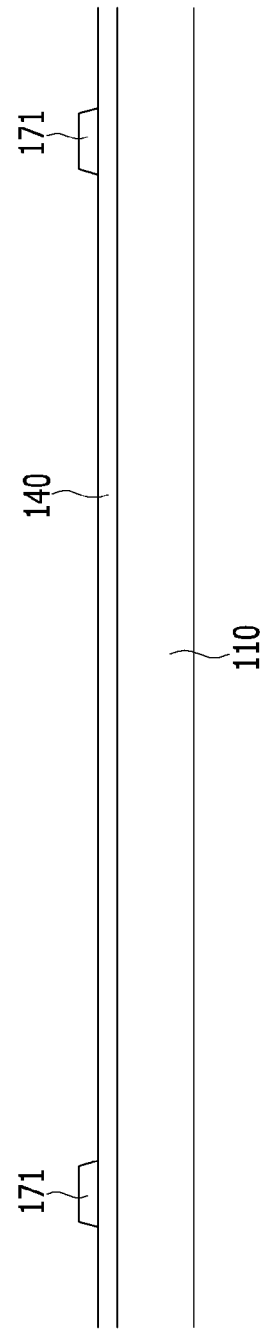
FIGS. 8 to 27 are cross-sectional views of a manufacturing method of a thin film transistor array panel according to an exemplary embodiment of the present invention.
Figure 9:
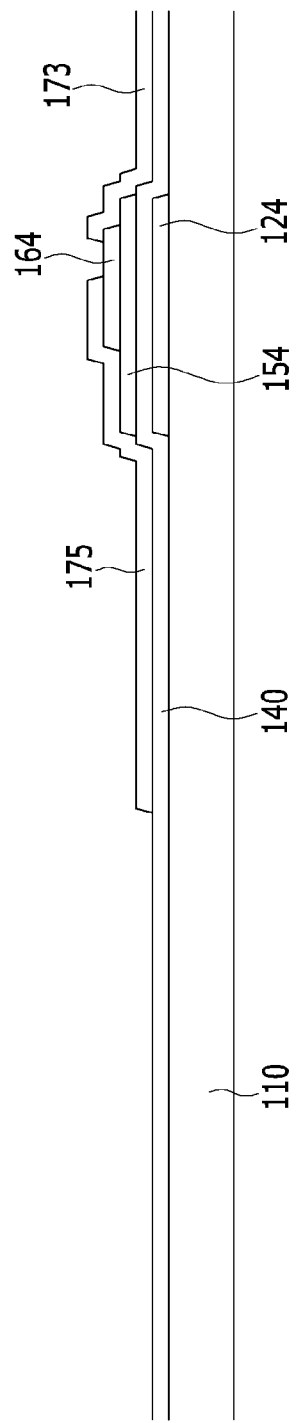
Figure 10:
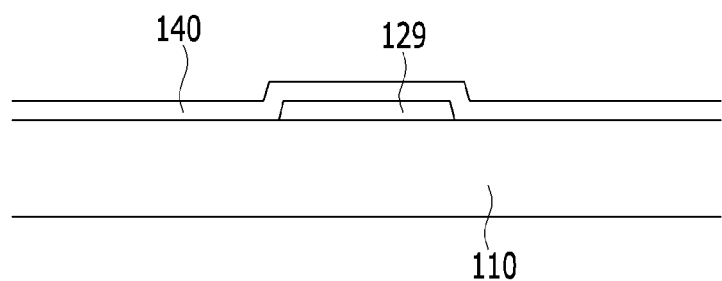
Figure 11:
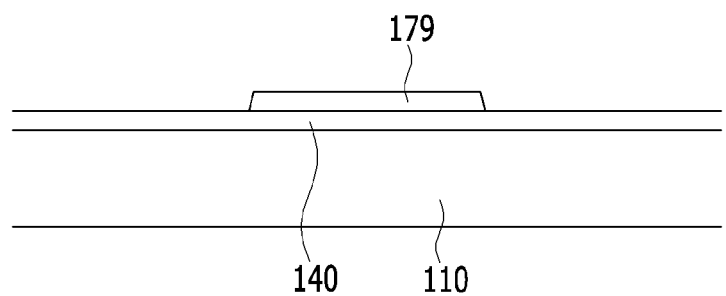
Figure 12:
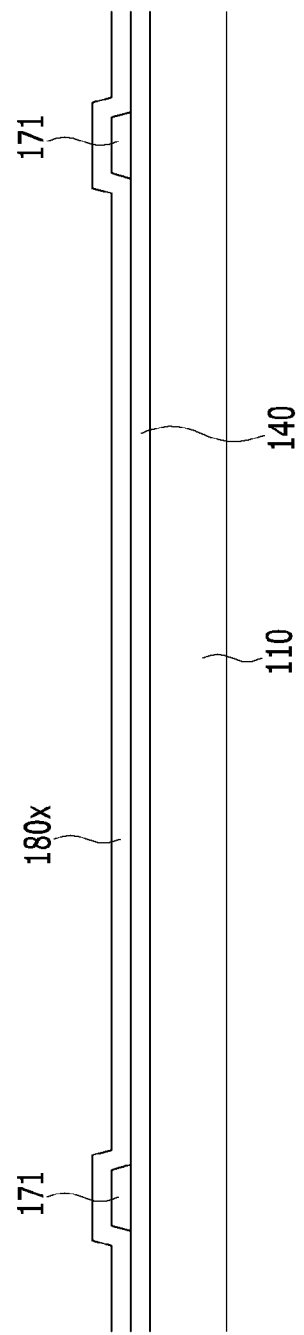
Figure 13:
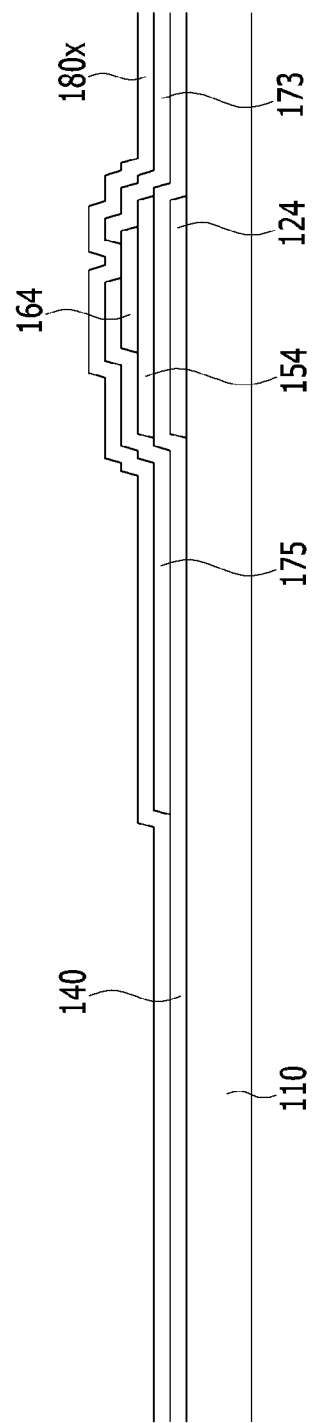
Figure 14:
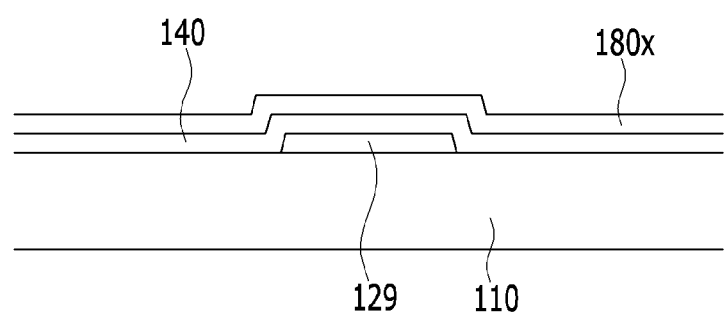
Figure 15:
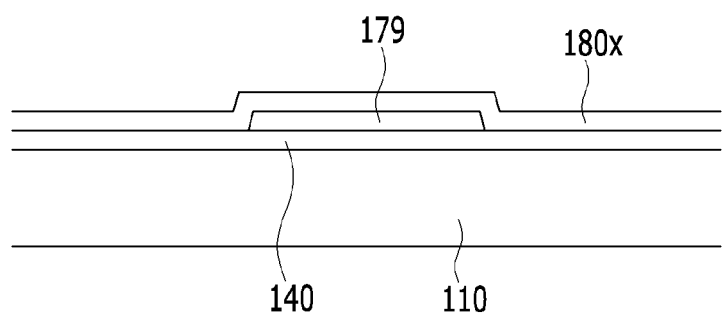
Figure 16:
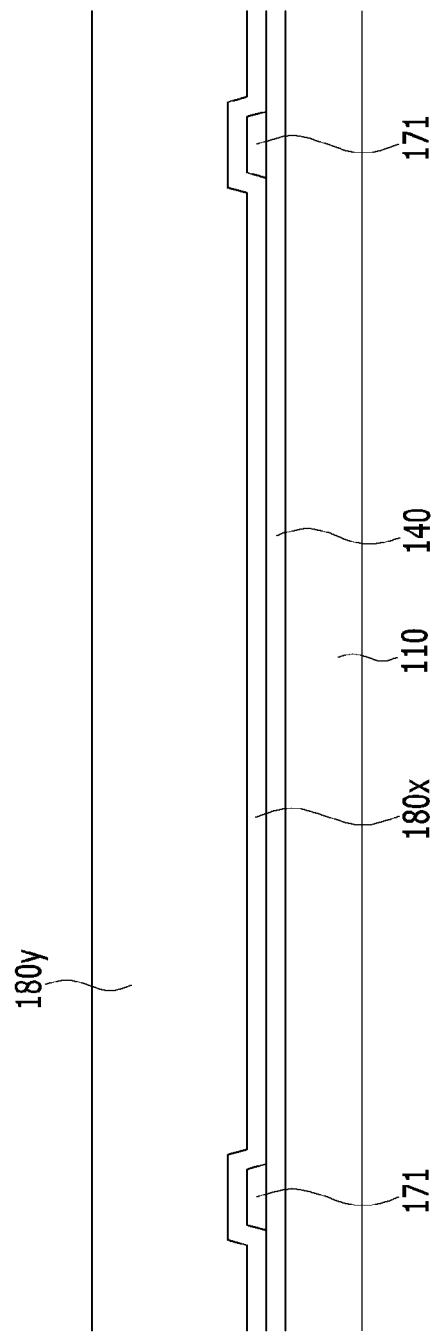
Figure 17:
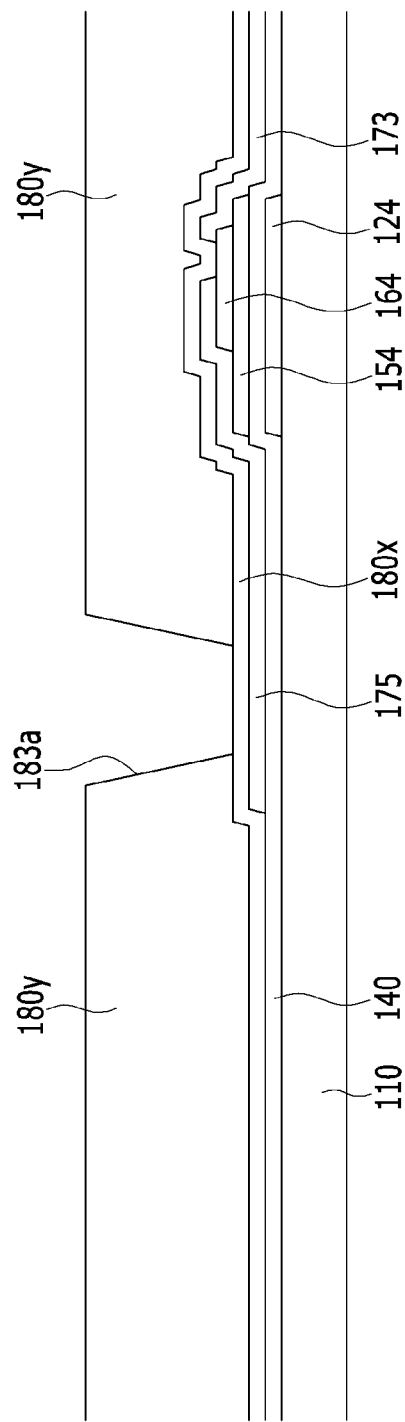
Figure 18:
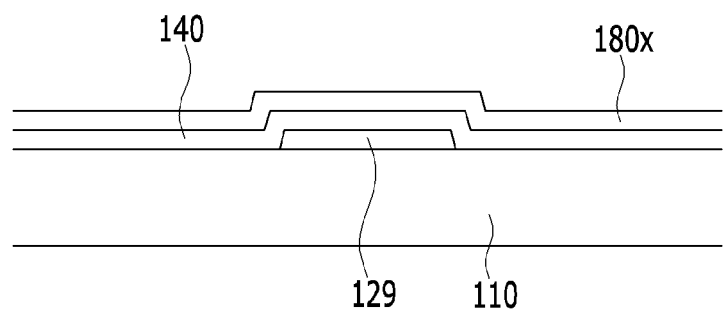
Figure 19:
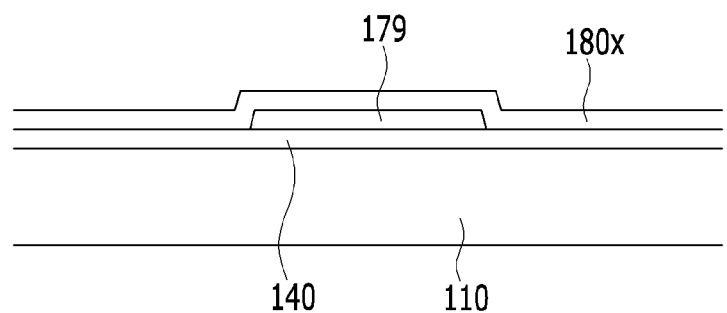
Figure 20:
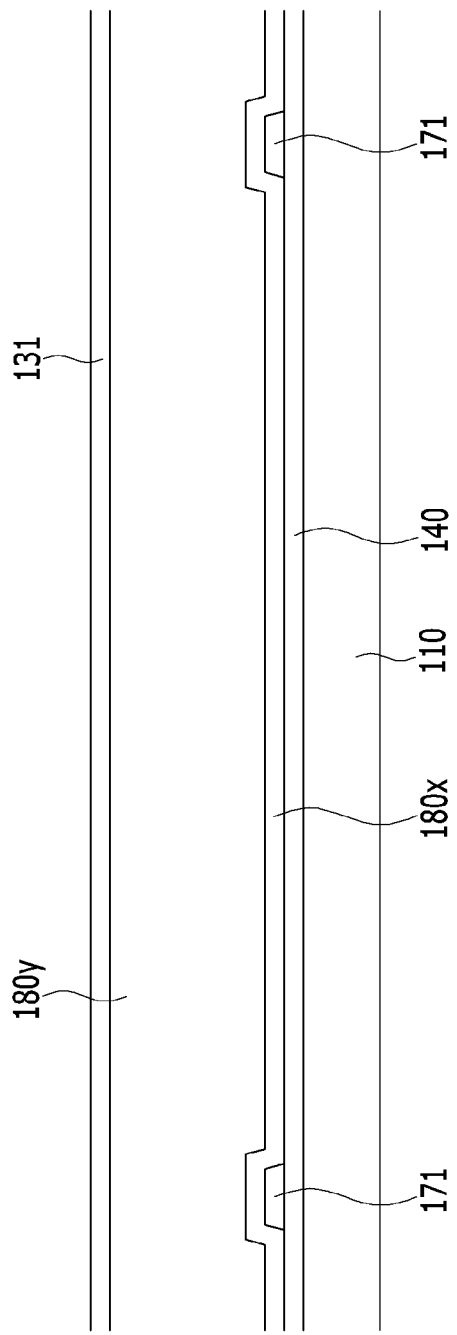
Figure 21:
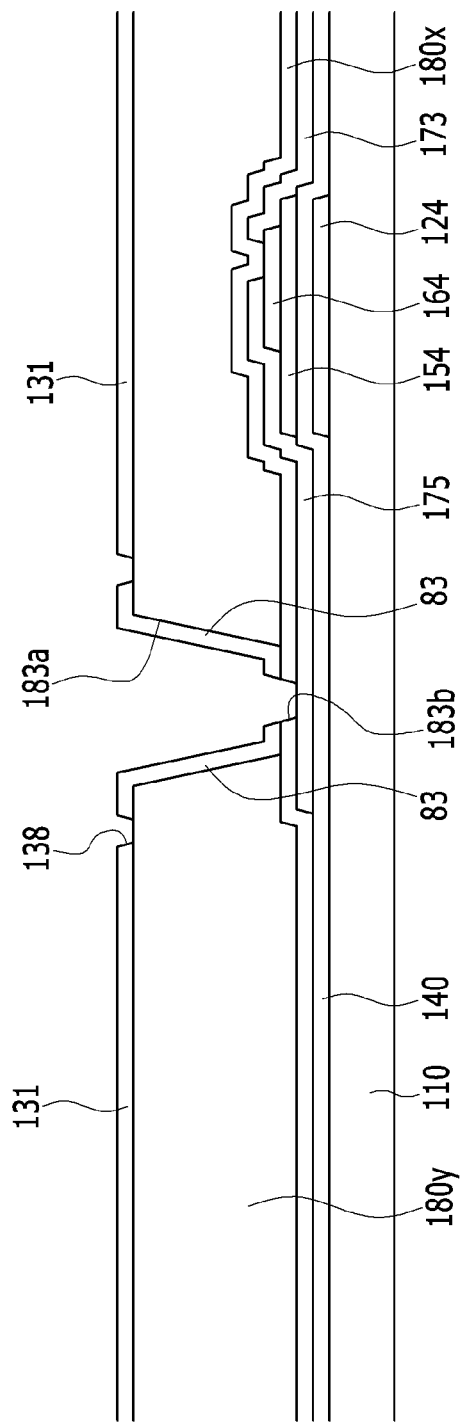
Figure 22:
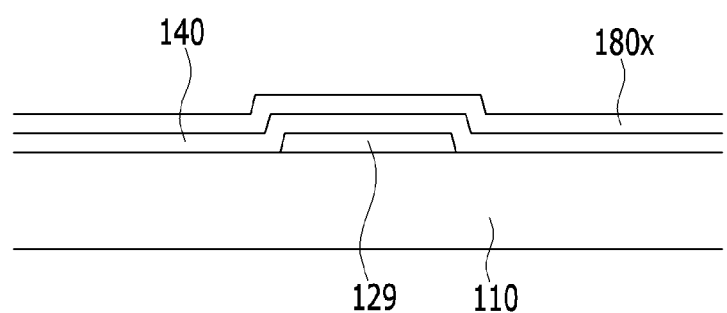
Figure 23:
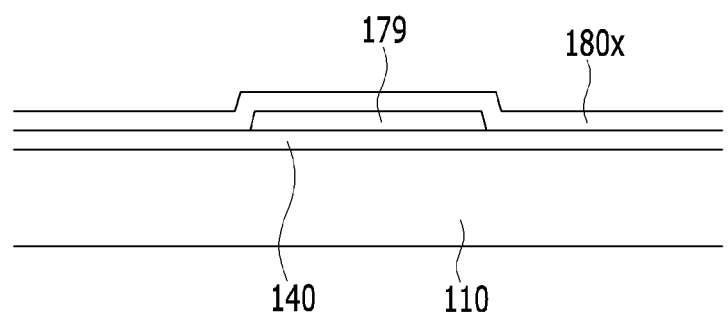
Figure 24:
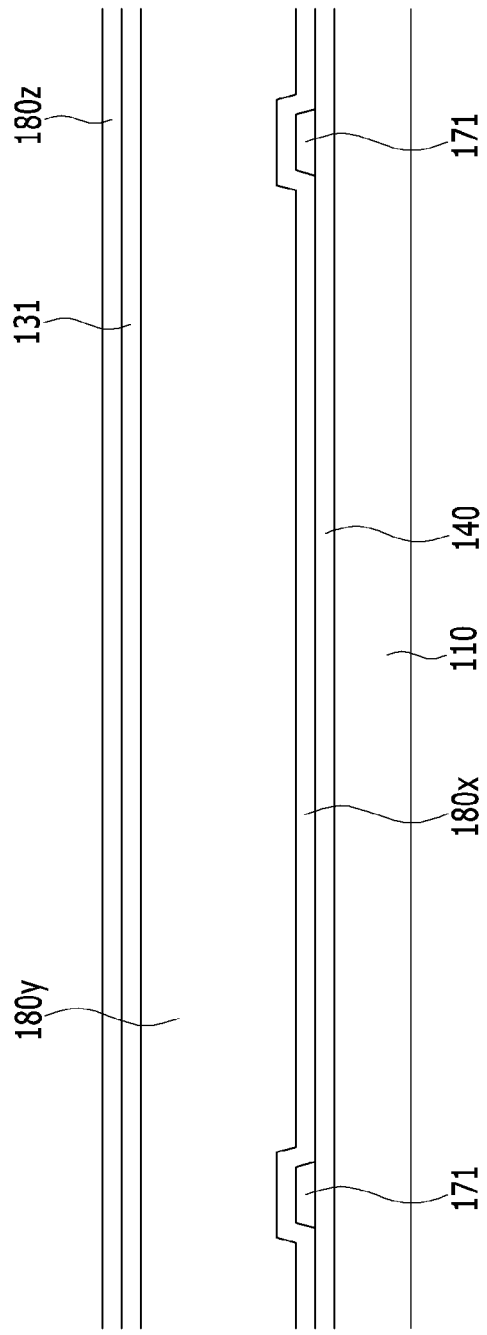
Figure 25:
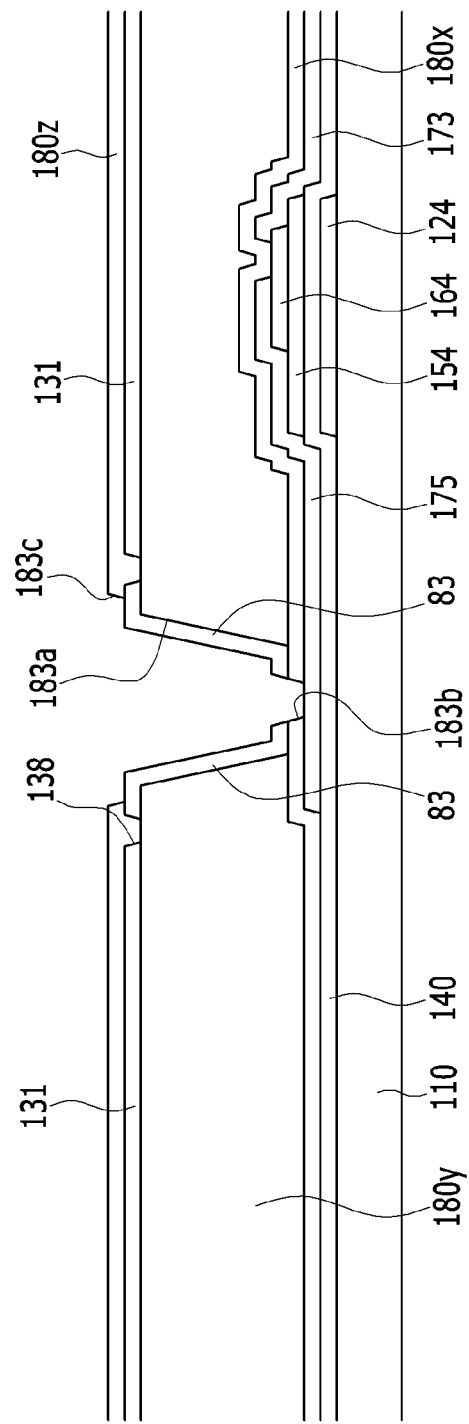
Figure 26:
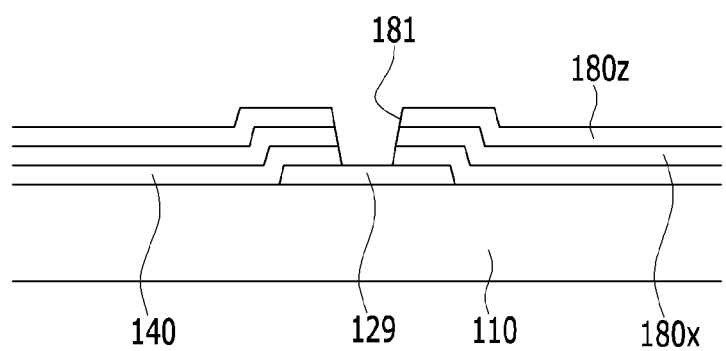
Figure 27:
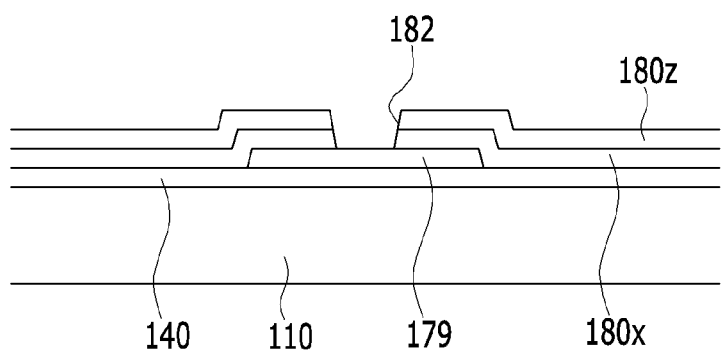

In the exemplary embodiment shown in the drawing, the third portion 183c of the first contact hole 183 formed in the third passivation layer 180z is formed so as to expose most of the first protection member 83. However, the third portion 183c of the first contact hole 183 may be formed so as to expose a part of the first protection member 83 and a part of the second portion 183b of the first contact hole 183, which will be described with reference to FIG. 7. FIG. 7 is a cross-sectional view of a part of a thin film transistor array panel according to another exemplary embodiment of the present invention. Referring to FIG. 7, the third passivation layer 180z partially covers the first protection member 83. As described above, the third passivation layer 180z may partially cover the first protection member 83. However, the third portion 183c of the first contact hole 183 is formed so as to expose a part of the first protection member 83 and a part of the second portion 183b of the first contact hole 183. By doing this, the second field generating electrode 191 formed on the third passivation layer 180z and a part of the drain electrode 175 that is exposed by the first contact hole 183 are connected to each other.

Referring to FIGS. 1 to 6 again, in the first passivation layer 180x, the second passivation layer 180y, and the gate insulating layer 140, a second contact hole 184 that partially exposes the common voltage line 125 is formed. The second contact hole 184 has a first portion 184a formed on the second passivation layer 180y, and a second portion 184b formed on the first passivation layer 180x and the gate insulating layer 140. A side of the first portion 184a of the second contact hole 184 formed in the second passivation layer 180y is covered with a second protection member 84 that is connected to the first field generating electrode 131. The second portion 184b of the second contact hole 184 formed in the first passivation layer 180x and the gate insulating layer 140 is formed by etching the first passivation film 180x and the gate insulating layer 140 using the second protection member 84 as an etching mask. Therefore, the second portions 184b of the first contact hole 184 formed in the first passivation layer 180x and the gate insulating layer 140 are aligned to an edge of the second protection member 84 of the second portion 184b of the second contact hole 184.

Since at least a part of the side of the second passivation layer 180y is covered by the second protection member 84, when the first passivation layer 180x and the third passivation layer 180z are etched, it prevents the second passivation layer 180y from being overetched. Therefore, by preventing the second passivation layer 180y from being overetched, it is possible to prevent the second contact hole 184 from being wider.

A part of the common voltage line 125 exposed through the second contact hole 184 is electrically connected to the second protection member 84 that covers the side of the second passivation layer 180y and is connected to the first field generating electrode through a first connecting member 94 that is formed on the third passivation layer 180z. Accordingly, the common voltage line 125 is electrically connected to the first field generating electrode 131. The first connecting member 94 is formed of the same layer as the second field generating electrode 191.

A third contact hole 181 that exposes the gate pad 129 is formed in the first passivation layer 180x, the third passivation layer 180z, and the gate insulating layer 140. The third contact hole 181 may be at least one or more and the plan shape thereof may be a polygon such as quadrangle, or circle or oval.

A second connecting member 81 is formed in the third contact hole 181. The second connecting member 81 is formed of the same layer as the second field generating electrode 191.

A fourth contact hole 182 that exposes a data pad 179 is formed in the first passivation layer 180x and the third passivation layer 180z. The fourth contact hole 182 may be at least one or more and the plan shape thereof may be a polygon such as quadrangle, or circle or oval.

A third connecting member 82 is formed in the fourth contact hole 182. The third connecting member 82 is formed of the same layer as the second field generating electrode 191 together.

In the exemplary embodiment shown in the drawing, even though the second passivation layer 180y is removed from a region corresponding to the gate pad 129 and the data pad 179, in the case of the thin film transistor array panel according to another exemplary embodiment of the present invention, at least a part of the second passivation layer 180y may be disposed in a region corresponding to the gate pad 129 and the data pad 179. In this case, the contact holes 181 and 182 that expose the gate pad 129 and the data pad 179 may have a first portion formed on the second passivation layer 180y and the second portion formed on the first passivation layer 180x, which is similar to the first contact hole 183. Further, the thin film transistor array panel may further include a protection member that covers the side of the second passivation layer 180y that forms the first portions of the contact holes 181 and 182.

The first field generating electrode 131 is connected to the common voltage line 125 through the second contact hole 184 to be applied with a common voltage and the second field generating electrode 191 is connected to the drain electrode 175 through the first contact hole 183 to be applied with a data voltage.

The first field generating electrode 131 and the second field generating electrode 191 to which the common voltage and the data voltage are applied generate an electric field in the liquid crystal layer (not shown).

In the case of the thin film transistor array panel according to the present exemplary embodiment, a plate type first field generating electrode 131 is disposed below the third passivation layer 180z and a second field generating electrode 191 having branches is disposed on the third passivation layer 180z. However, in the case of a thin film transistor array panel according to another exemplary embodiment of the present invention, the second field generating electrode 191 having branches is disposed below the third passivation layer 180z and the plate type first field generating electrode 131 is disposed on the third passivation layer 180z. Further, any one of the first field generating electrode 131 and the second field generating electrode 191 may include a branch electrode and the other one may be a plate type electrode. In addition, the common voltage is applied to any one of the first field generating electrode 131 and the second field generating electrode 191, and the data voltage is applied to the other one.

In other words, all characteristics of the thin film transistor array panel according to an exemplary embodiment of the present invention may also be applied to all case where both of the common electrode and the pixel electrode, which are field generating electrodes, are disposed on the thin film transistor array panel.

As described above, the thin film transistor array panel according to the exemplary embodiment of the present invention forms a contact hole in the second passivation layer 180y that is formed of an organic insulator, protects the side of the contact hole by covering with a protection member formed of a transparent conductive material and formed of the same layer as the first field generating electrode 131, and etches the first passivation layer 180x (and the gate insulating layer 140) below the second passivation layer 180y using the protection member as a mask. Therefore, it is possible to prevent the second passivation layer 180y formed of an organic insulator from being overetched while etching the insulating layer below the second passivation layer 180y, so that the contact hole is prevented from being wider.

Further, since the protection member is formed of the same layer as the field generating electrode, an additional process for forming the protection member is not required. In addition, since the protection member is formed of the transparent conductive material, it is possible to enhance the electrical connection between the layer exposed through the contact hole and the layer formed on the protection member.

Now, referring to FIGS. 8 to 27, a manufacturing method of a thin film transistor array panel according to an exemplary embodiment of the present invention will be described. FIGS. 8 to 27 are cross-sectional views of a manufacturing method of a thin film transistor array panel according to an exemplary embodiment of the present invention.

First, as shown in FIGS. 8 to 11, a gate line 121 including a gate electrode 124 and a gate pad 129 and a gate conductor including a common voltage line 125 are formed on an insulation substrate 110 and a gate insulating layer 140 is deposited on the gate conductors 121 and 125. A semiconductor 154 is formed on the gate insulation layer 140. The semiconductor 154 may be an oxide semiconductor, which is formed of GIZO, ZTO (ZnSnO) or IZO. An etch stop layer 164 is formed on the semiconductor 154. The etch stop layer 164 is formed of an insulating material such as silicon nitride or silicon oxide. Further, a data line 171 including a source electrode 173 and a data pad 179 and a data conductor including a drain electrode 175 are formed on a part of the semiconductor 154 that is not covered with the etch stop layer 164 as well as a part of the etch stop layer 164.

Next, referring to FIGS. 12 to 15, a first passivation layer 180x is deposited on the data conductors 171 and 175. The first passivation layer 180x may be formed of an organic insulating material or an inorganic insulating material.

As shown in FIGS. 16 to 19, a second passivation layer 180y is formed on the first passivation layer 180x. In this case, a first portion 183a of the first contact hole 183 is formed in the second passivation layer 180y and the second passivation layer 180y is removed from a region corresponding to the gate pad 129 and the data pad 179.

Next, referring to FIGS. 20 to 23, a first field generating electrode is formed on the second passivation layer 180y and simultaneously with this, forms a first protection member 83 that covers at least a part of the side of the first portion 183a of the first contact hole 183 formed in the second passivation layer 180y.

Referring to FIGS. 24 to 27, a third passivation layer 180z is formed on a part of the first field generating electrode 131 and the first passivation layer 180x. The third passivation layer 180z has a third portion 183c of the first contact hole 183 that exposes at least a part of the first protection member 83. Here, the first passivation layer 180x is also etched by using the exposed first protection member 83 as an etching mask to form a second portion 183b of the first contact hole 183. Accordingly, the third portion 183c of the first contact hole 183 formed in the third passivation layer 180z exposes the second portion 183b of the first contact hole 183 as well as the part of the first protection member 83. In this case, the third passivation layer 180z and the first passivation layer 180x that cover the gate pad 129 and the data pad 179 are etched together to form a third contact hole 181 and a fourth contact hole 182.

Finally, as shown in FIGS. 2 to 5, a second field generating electrode 191 and connecting members 81 and 82 are formed on the third passivation layer 180z.

As described above, the manufacturing method of the thin film transistor array panel according to an exemplary embodiment of the present invention forms the contact hole in the second passivation layer 180y formed of an organic insulator, protects the side of the contact hole by covering with the protection member formed of the same layer as the first field generating electrode 131 and formed of a transparent conductive material, and etches the first passivation layer 180x (and gate insulating layer 140) below the second passivation layer 180y using the protection member as a mask. Therefore, it is possible to prevent the second passivation layer 180y formed of an organic insulator from being overetched while etching the insulating layer below the second passivation layer, so that the contact hole is prevented from being made excessively wide.

Further, since the protection member is formed of the same layer as the field generating electrode, an additional process for forming the protection member is not required. In addition, since the protection member is formed of the transparent conductive material, it is possible to enhance the electrical connection between the layer exposed through the contact hole and the layer formed on the protection member.

Figure 28:
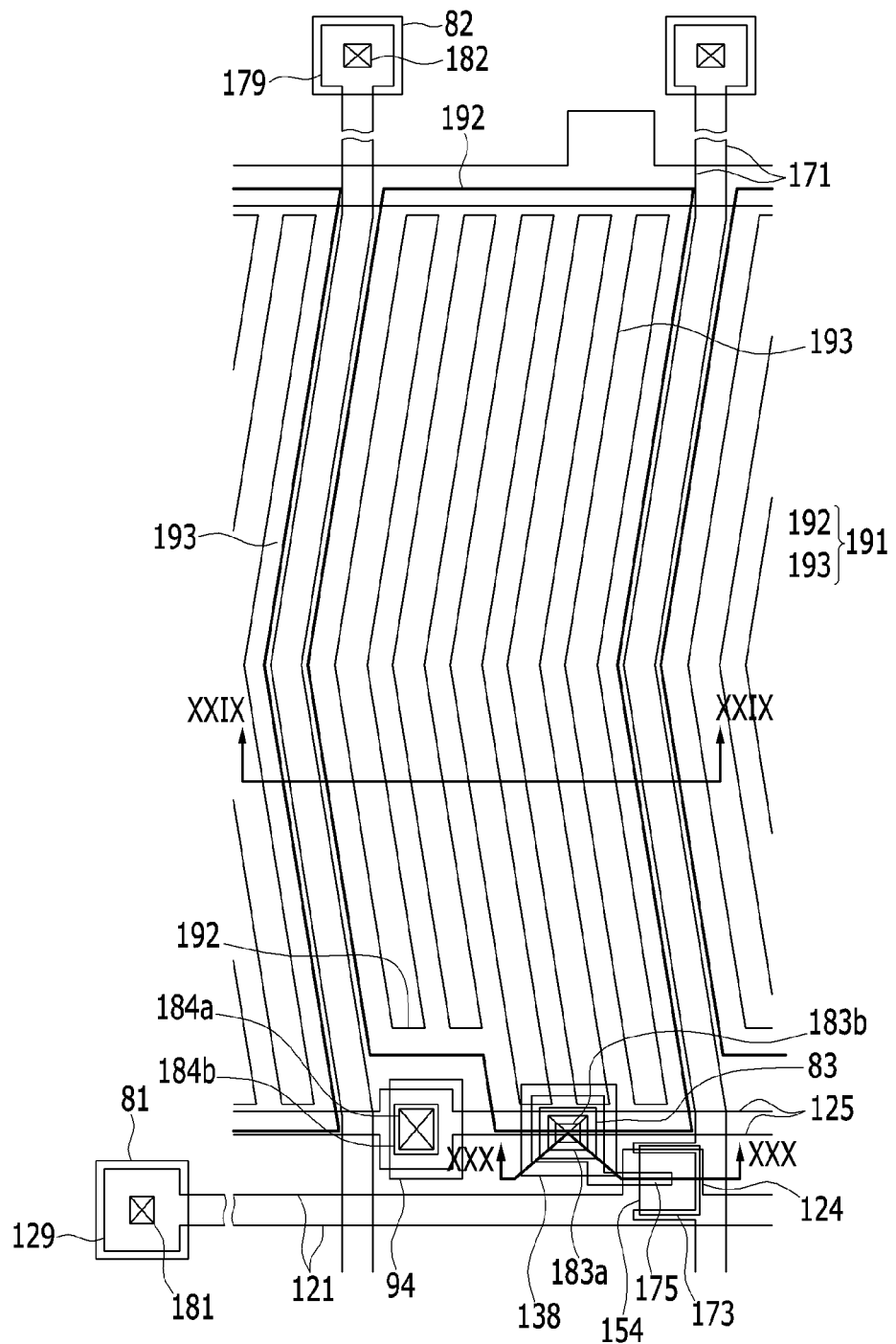
FIG. 28 is a layout view of a thin film transistor array panel according to the exemplary embodiment of the present invention.

Now, referring to FIGS. 28 to 30, a thin film transistor array panel according to another exemplary embodiment of the present invention will be described. FIG. 28 is a layout view of a thin film transistor array panel according to the exemplary embodiment of the present invention, FIG. 29 is a cross-sectional view of the thin film transistor array panel of FIG. 28 taken along line XXIX-XXIX, and FIG. 30 is a cross-sectional view of the thin film transistor array panel of FIG. 28 taken along line XXX-XXX.

Figure 29:
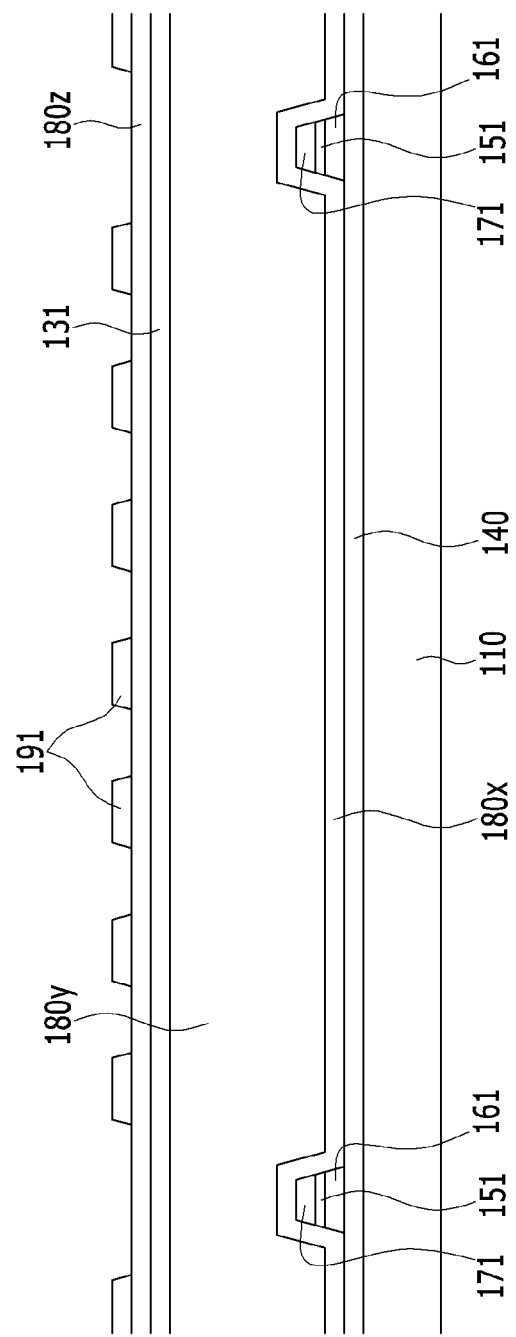
FIG. 29 is a cross-sectional view of the thin film transistor array panel of FIG. 28 taken along line XXIX-XXIX.
Figure 30:
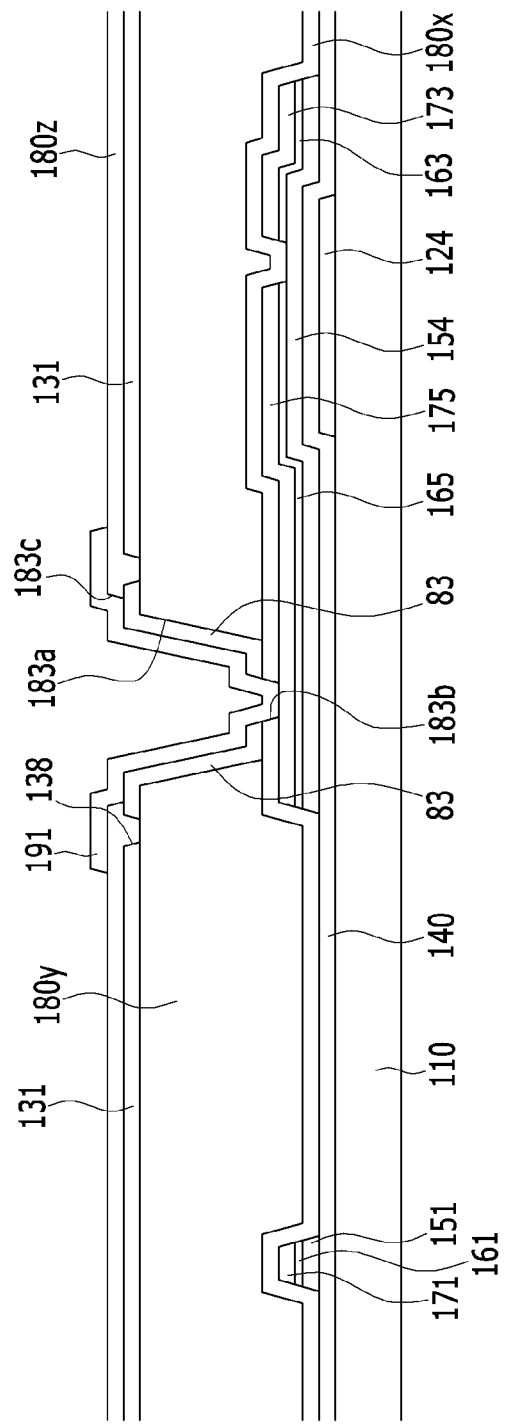
FIG. 30 is a cross-sectional view of the thin film transistor array panel of FIG. 28 taken along line XXX-XXX.

Referring to FIGS. 28 to 30, the thin film transistor array panel according to the present exemplary embodiment is similar to the thin film transistor array panel according to the exemplary embodiment shown in FIGS. 1 to 6. Description of already-described parts will be omitted.

In the thin film transistor array panel according to the present exemplary embodiment, the semiconductors 151 and 154 are not oxide semiconductors. Therefore, the etch stop layer 164 is not formed on the semiconductors 151 and 154. Further, ohmic contacts 161, 163, and 165 are formed between the semiconductors 151 and 154 and the data line 171 and the drain electrode 175.

In addition, the plan shape of the data line 171 and the drain electrode 175 is almost the same as the semiconductors 151 and 154 excepting the channel of the thin film transistor. In other words, the semiconductors 151 and 154 include a first portion 151 disposed below the data line 171 and a second portion 154 disposed in the channel of the thin film transistor. The ohmic contacts 161, 163, and 165 also include a first portion 161 disposed between the first portion 151 of the semiconductors 151 and 154 and the data line 171 and second portions 163 and 165 disposed between the second portion 154 of the semiconductors 151 and 154 and the source electrode 173 and the drain electrode 175.

In the thin film transistor according to the present exemplary embodiment, similar to the thin film transistor array panel according to the exemplary embodiment shown in FIGS. 1 to 6, a first contact hole 183 that partially exposes the drain electrode 175 is formed in the first passivation layer 180x, the second passivation layer 180y, and the third passivation layer 180z. The first contact hole has a first portion 183a that is formed in the second passivation layer 180y, a second portion 183b that is formed in the first passivation layer 180x, and a third portion 183c that is formed in the third passivation layer 180z.

A first protection member 83 is formed on at least a part of a side of the first portion 183a of the first contact hole 183 formed in the second passivation layer 180y. The first protection member 83 may be formed of the same layer as the first field generating electrode 131. The second portion 183b of the first contact hole 183 formed in the first passivation layer 180x is formed by etching the first passivation layer 180x using the first protection member 83 as an etching mask. Accordingly, the second portions 183b of the first contact hole 183 formed in the first passivation layer 180x are aligned to the edge of the first protection member 83.

Since at least a part of the side of the second passivation layer 180y is covered by the first protection member 83, when the first passivation layer 180x and the third passivation layer 180z are etched, the second passivation layer 180y formed of an organic film is prevented from being overetched. Therefore, by preventing the second passivation layer 180y from being overetched, it is possible to prevent the first contact hole 183 from being made excessively wide.

Further, since the first protection member 83 is formed of the same layer as the first field generating electrode 131, the first protection member 83 is formed of a transparent conductor. Therefore, the drain electrode 175b exposed through the first contact hole 183 electrically contacts a second field generating electrode 191 formed thereon. More specifically, the first protection member 83 formed of a conductor is disposed between the drain electrode 175 exposed by the second portion 183b of the first contact hole 183 and the second field generating electrode 191 formed thereon. Therefore, the drain electrode 175 and the second field generating electrode 191 are electrically connected to each other through the first protection member 83. Accordingly, even if the second field generating electrode 191 becomes thinner or is cut on a part of the first protection member 83, a signal of the drain electrode 175 is still transmitted to the second field generating electrode 191 through the first protection member 83.

As described above, the thin film transistor array panel according to the exemplary embodiment of the present invention forms a contact hole in the second passivation layer 180y that is formed of an organic insulator, protects the side of the contact hole by covering it with a protection member formed of a transparent conductive material and formed of the same layer as the first field generating electrode 131, and etches the first passivation layer 180x (and the gate insulating layer 140) below the second passivation layer 180y using the protection member as a mask. Therefore, it is possible to prevent the second passivation layer 180y formed of an organic insulator from being overetched while etching the insulating layer below the second passivation layer 180y, so that the contact hole is prevented from being made excessively wide.

Further, since the protection member is formed of the same layer as the field generating electrode, an additional process for forming the protection member is not required. In addition, since the protection member is formed of the transparent conductive material, it is possible to enhance the electrical connection between the layer exposed through the contact hole and the layer formed on the protection member.

Lots of characteristics of the thin film transistor array panel according to the exemplary embodiment with reference to FIGS. 1 to 6 described above are applicable to the thin film transistor array panel according to the present exemplary embodiment.

Figure 31:
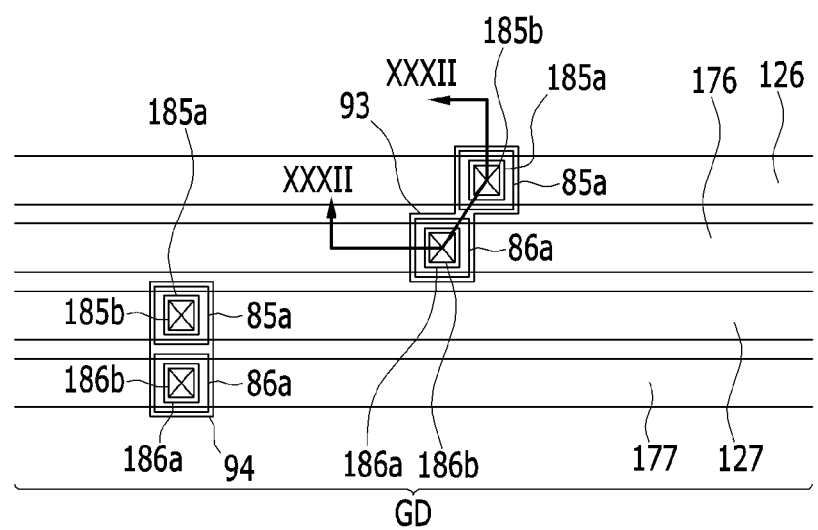
FIG. 31 is a layout view partially illustrating a part of a thin film transistor array panel according to another exemplary embodiment of the present invention.
Figure 32:
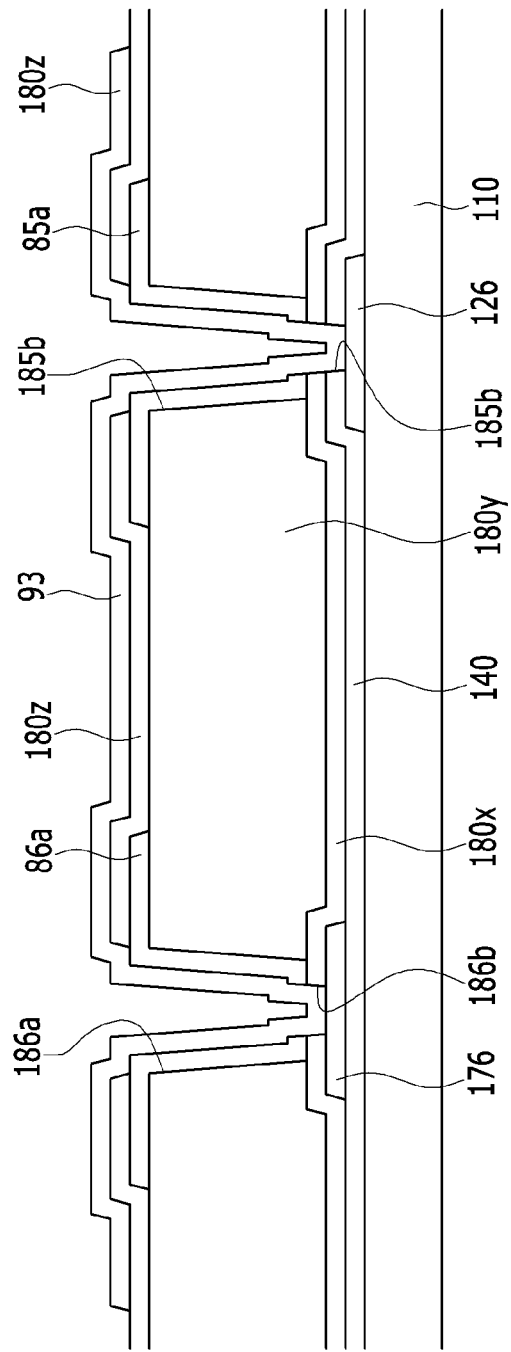
FIG. 32 is a cross-sectional view of the thin film transistor array panel of FIG. 31 taken along line XXXII-XXXII.

Next, referring to FIG. 31 and FIG. 32, a thin film transistor array panel according to another exemplary embodiment of the present invention will be described. FIG. 31 is a layout view partially illustrating a thin film transistor array panel according to another exemplary embodiment of the present invention, and FIG. 32 is a cross-sectional view of the thin film transistor array panel of FIG. 31 taken along line XXXII-XXXII.

A driving circuit DP that is formed around a display area on which a plurality of pixels are formed of a thin film transistor array panel according to the present exemplary embodiment is described with reference to FIGS. 31 and 32.

In the driving circuit DP, a plurality of driving gate wiring lines 126 and 127, a plurality of driving data wiring lines 176 and 177, and a plurality of transistors (not shown) are formed.

The driving gate wiring lines 126 and 127 are formed of the same gate conductor as the gate line described above, and the driving data wiring lines 176 and 177 are formed of the same data conductor as the data line described above, which will be described in detail.

The driving gate wiring lines 126 and 127 that are formed of the gate conductor are formed on an insulation substrate 110. A gate insulating layer 140 is formed on the driving gate wiring lines 126 and 127.

The driving data wiring lines 176 and 177 are formed on the gate insulating layer 140. A first passivation layer 180x is disposed on the driving data wiring lines 176 and 177 and the gate insulating layer 140. A second passivation layer 180y is disposed on the first passivation layer 180x. A third passivation layer 180z is formed on the second passivation layer 180y.

A fifth contact hole that partially exposes the driving gate wiring lines 126 and 127 is formed in the second passivation layer 180y, the first passivation layer 180x, and gate insulating layer 140. A sixth contact hole 186 that partially exposes the driving gate wiring lines 176 and 177 is formed in the second passivation layer 180y and the first passivation layer 180x.

The fifth contact hole 185 includes a first portion 185a that is formed in the second passivation layer 180y and a second portion 185b that is formed in the second passivation layer 180x and the gate insulating layer 140. A third protection member 85a is formed on at least a part of a side of the second passivation layer 180y that forms the first portion 185a of the fifth contact hole 185. The third protection member 85a may be formed of the same layer as the first field generating electrode 131 described above together.

The second portion 185b of the fifth contact hole 185 formed in the first passivation layer 180x is formed by etching the first passivation film 180x and the gate insulating layer 140 using the third protection member 85a as an etching mask. Therefore, the second portions 185b of the fifth contact hole 185 are arranged along a part of the edge of the third protection member 85a.

The sixth contact hole 186 includes a first portion 186a formed in the second passivation layer 180y, and a second portion 186b formed in the second passivation layer 180x. A fourth protection member 86a is formed on at least a part of a side of the second passivation layer 180y that forms the first portion 186a of the sixth contact hole 186. The fourth protection member 86a may be formed of the same layer as the first field generating electrode 131 described above together.

The second portion 186b of the sixth contact hole 186 formed in the first passivation layer 180x is formed by etching the first passivation film 180x using the fourth protection member 86a as an etching mask. Therefore, the second portions 186b of the sixth contact hole 186 are arranged along a part of the edge of the fourth protection member 86a.

Since at least a part of the sides of the first portions 185a and 186a of the contact holes 185 and 186 of the second passivation layer 180y is covered by the protection members 85a and 86a, when the first passivation layer 180x (and the gate insulating layer 140) is etched, it prevents the second passivation layer 180y formed of an organic film from being overetched. Therefore, by preventing the second passivation layer 180y from being overetched, it is possible to prevent the contact holes 185 and 186 from being made excessively wide.

A part of the driving gate wiring lines 126 and 127 that is exposed through the fifth contact hole 185 and a part of the driving data wiring lines 176 and 177 that is exposed through the sixth contact hole 186 are electrically connected to each other through the fourth connecting member 93.

As described above, when the contact holes 185 and 186 that expose the driving gate wiring lines 126 and 127 and the driving data wiring lines 176 and 177 are formed, the thin film transistor array panel according to the present exemplary embodiment forms the contact hole in the second passivation layer 180y, protects the side of the contact hole by covering the protection members 85a and 86a formed of the same layer as the first field generating electrode 131 and formed of the transparent conductive material, and etches the first passivation layer 180x (and the gate insulating layer 140) below the second passivation layer 180y using the protection member 85a and 86a as a mask. Therefore, it is possible to prevent the second passivation layer 180y formed of an organic insulator from being overetched while etching the insulating layer below the second passivation layer, so that the contact hole is prevented from being made excessively wide.

Further, since the protection member is formed of the same layer as the field generating electrode, an additional process for forming the protection member is not required. In addition, since the protection member is formed of the transparent conductive material, it is possible to enhance the electrical connection between the layer exposed through the contact hole and the layer formed on the protection member.

Lots of characteristics of the thin film transistor array panel according to the exemplary embodiments described above are applicable to the thin film transistor array panel according to the present exemplary embodiment.

In the thin film transistor array panel according to the present exemplary embodiment, any one of overlapping two field generating electrodes is a plate and the other one has a branch. However, the present invention is applicable to any kinds of thin film transistor array panel having two field generating electrodes in one display panel.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a thin film transistor array panel, comprising:
   forming a thin film transistor on a substrate,
   forming a first passivation layer on the thin film transistor,
   forming a second passivation layer including an organic insulator on the first passivation layer,
   forming a first portion of a first contact hole in the second passivation layer that partially exposes a top surface of the first passivation layer,
   forming a first protection member on at least a part of a side of the second passivation layer, the first protection member exposing the partially exposed top surface of the first passivation layer, and a first field generating electrode on the second passivation layer
   forming a second portion of the first contact hole in the first passivation layer using the first protection member as a mask,
   forming a third passivation layer on the first field generating electrode, and
   forming a second field generating electrode on the third passivation layer.

2. The manufacturing method of claim 1, wherein:
the forming a third passivation layer further includes:
   forming an opening that partially exposes the first protection member and the second portion of the first contact hole in the third passivation layer.

3. The manufacturing method of claim 2, wherein:
the forming a thin film transistor further includes:
   forming a semiconductor,
wherein the semiconductor is an oxide semiconductor.

4. The manufacturing method of claim 3, wherein:
the forming a thin film transistor further includes,
   forming a gate electrode and a gate line of the thin film transistor, and
   forming a source electrode and a data line of the thin film transistor, and
the forming of a second passivation layer includes:
   removing the second passivation layer from a region corresponding to a gate pad of the gate line and a data pad of the data line.

5. The manufacturing method of claim 4, wherein:
the forming of a second passivation layer further includes:
   depositing a color filter.

6. The manufacturing method of claim 5, wherein:
at least one of the forming of a first field generating electrode and the forming of a second field generating electrode further includes:
   forming a plurality of branch electrodes.

7. The manufacturing method of claim 1, wherein:
the forming of a thin film transistor further includes:
   forming a semiconductor, and
the semiconductor is an oxide semiconductor.

8. The manufacturing method of claim 7, wherein:
the forming of a thin film transistor further includes
   forming a gate electrode and a gate line of the thin film transistor, and
   forming a source electrode and a data line of the thin film transistor, and
the forming of a second passivation layer further includes:
   removing the second passivation layer from a region corresponding to a gate pad of the gate line and a data pad of the data line.

9. The manufacturing method of claim 8, wherein:
the forming of a second passivation layer further includes:
   depositing a color filter.

10. The manufacturing method of claim 9, wherein:
at least one of the forming of a first field generating electrode and the forming of a second field generating electrode further includes:
   forming a plurality of branch electrodes.

11. The manufacturing method of claim 1, wherein:
the forming of a thin film transistor further includes
   forming a gate electrode and a gate line of the thin film transistor, and
   forming a source electrode and a data line of the thin film transistor, and
the forming of a second passivation layer further includes:
   removing the second passivation layer from a region corresponding to a gate pad of the gate line and a data pad of the data line.

12. The manufacturing method of claim 11, wherein:
the forming of a second passivation layer further includes:
   depositing a color filter.

13. The manufacturing method of claim 12, wherein:
at least one of the forming of a first field generating electrode and the forming of a second field generating electrode further includes:
   forming a plurality of branch electrodes.

14. The manufacturing method of claim 1, wherein:
the forming of a second passivation layer further includes:

depositing a color filter.
15. The manufacturing method of claim 14, wherein:
at least one of the forming of a first field generating electrode and the forming of a second field generating electrode further includes:
   forming a plurality of branch electrodes.
16. The manufacturing method of claim 1, wherein:
at least one of the forming of a first field generating electrode and the forming of a second field generating electrode includes:
   forming a plurality of branch electrodes.

\* \* \* \* \*